United States Patent
Shimizu

(10) Patent No.: US 9,929,067 B2
(45) Date of Patent: Mar. 27, 2018

(54) CERAMIC PACKAGE, METHOD OF MANUFACTURING THE SAME, ELECTRONIC COMPONENT, AND MODULE

(71) Applicant: CANON KABUSHIKI KAISHA, Tokyo (JP)

(72) Inventor: Koichi Shimizu, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/481,807

(22) Filed: Apr. 7, 2017

(65) Prior Publication Data
US 2017/0309533 A1    Oct. 26, 2017

(30) Foreign Application Priority Data

Apr. 26, 2016  (JP) .................................. 2016-088481

(51) Int. Cl.
| | | |
|---|---|---|
| H01L 23/15 | (2006.01) | |
| H01L 23/498 | (2006.01) | |
| H01L 21/48 | (2006.01) | |
| H01L 23/14 | (2006.01) | |

(52) U.S. Cl.
CPC ............ *H01L 23/15* (2013.01); *H01L 21/486* (2013.01); *H01L 21/4807* (2013.01); *H01L 23/49805* (2013.01); *H01L 23/49827* (2013.01); *H01L 23/14* (2013.01); *H01L 2924/15787* (2013.01)

(58) Field of Classification Search
CPC . H01L 23/15; H01L 21/486; H01L 23/49827; H01L 23/49805
See application file for complete search history.

(56) References Cited

U.S. PATENT DOCUMENTS

| | | | |
|---|---|---|---|
| 6,207,905 B1 * | 3/2001 | Taga ....................... | C03C 3/108 174/255 |
| 6,576,999 B2 | 6/2003 | Sakai et al. | |
| 6,682,953 B2 | 1/2004 | Sakai et al. | |
| 2003/0128526 A1 * | 7/2003 | Sakai ................... | H01L 23/053 361/736 |

(Continued)

FOREIGN PATENT DOCUMENTS

| | | |
|---|---|---|
| JP | 6-238643 A | 8/1994 |
| JP | 10-270819 A | 10/1998 |

(Continued)

*Primary Examiner* — Walter H Swanson
(74) *Attorney, Agent, or Firm* — Fitzpatrick, Cella, Harper & Scinto

(57) ABSTRACT

A method of manufacturing a ceramic package is provided. An electrically conductive paste is applied to an inside of the first hole and an inside of the second hole of a ceramic green sheet. A ceramic member including first and second electrically conductive members is formed by burning the ceramic green sheet. The ceramic member is divided so as to divide each of the first and second electrically conductive members. A distance between first and second connecting portions is smaller than each of a length of the first connecting portion in a first direction and a length of the second connecting portion in a second direction. The length of the first connecting portion in the first direction is larger than a length of the first connecting portion in a third direction. The length of the second connecting portion has a similar relation.

17 Claims, 11 Drawing Sheets

(56) References Cited

U.S. PATENT DOCUMENTS

2012/0320536 A1* 12/2012 Yamamoto ............ H01L 21/561
361/728
2013/0049202 A1* 2/2013 Tani .................... H05K 3/4629
257/762

FOREIGN PATENT DOCUMENTS

| JP | 2000-195982 A | 7/2000 |
| --- | --- | --- |
| JP | 2002-026513 A | 1/2002 |
| JP | 2004-207592 A | 7/2004 |
| JP | 2004-303822 A | 10/2004 |
| JP | 2005-044886 A | 2/2005 |
| JP | 2005-183690 A | 7/2005 |
| JP | 2006-060265 A | 3/2006 |
| JP | 2008-141082 A | 6/2008 |
| JP | 2012-089818 A | 5/2012 |
| JP | 2015-065207 A | 4/2015 |

* cited by examiner

CERAMIC PACKAGE, METHOD OF MANUFACTURING THE SAME, ELECTRONIC COMPONENT, AND MODULE

BACKGROUND OF THE INVENTION

Field of the Invention

The present invention relates to a ceramic package, a method of manufacturing the same, an electronic component, and a module.

Description of the Related Art

A package for mounting an electronic device has been manufactured by using a ceramic package. Japanese Patent Laid-Open No. 2015-065207 has described a technique of using electrodes arranged on the side surfaces of a ceramic package as connecting portions to be jointed to a mounting board with solder. It is possible, by thus jointing the connecting portions on the side surfaces of the package with solder, to firmly couple the package and the mounting board to each other.

SUMMARY OF THE INVENTION

As a method of forming connecting portions on the side surfaces of a ceramic package, a method of forming a hole in a ceramic green sheet, forming an electrically conductive member passing through this hole, and dividing the ceramic green sheet on a plane passing through the hole. If wide connecting portions are formed on the side surfaces of the ceramic package by this method, the hole in the ceramic green sheet becomes larger accordingly, and the ceramic green sheet becomes deformed easily while manufacturing the package. If the ceramic green sheet becomes deformed, the ceramic green sheet may be damaged, or a wiring formed on the ceramic green sheet may be disconnected. Some embodiments of the present invention provide a technique of suppressing deformation in the ceramic green sheet while manufacturing the ceramic package including the connecting portions on its side surfaces.

According to some embodiments, a method of manufacturing a ceramic package is provided. The method includes forming a first hole and a second hole in a ceramic green sheet; applying an electrically conductive paste to an inside of the first hole and an inside of the second hole of the ceramic green sheet; forming a ceramic member including a first electrically conductive member passing through the first hole and a second electrically conductive member passing through the second hole by burning the ceramic green sheet to which the electrically conductive paste is applied; and dividing the ceramic member so as to divide each of the first electrically conductive member and the second electrically conductive member. A first connecting portion is formed by a part of the first electrically conductive member on a side surface appearing by dividing the ceramic member, and a second connecting portion is formed by a part of the second electrically conductive member on a side surface appearing by dividing the ceramic member. A distance between the first connecting portion and the second connecting portion is smaller than each of a length of the first connecting portion in a first direction parallel to both the side surface on which the first connecting portion is arranged and a bottom surface of the ceramic package, and a length of the second connecting portion in a second direction parallel to both the side surface on which the second connecting portion is arranged and the bottom surface of the ceramic package. The length of the first connecting portion in the first direction is larger than a length of the first connecting portion in a third direction perpendicular to the bottom surface of the ceramic package. The length of the second connecting portion in the second direction is larger than a length of the second connecting portion in the third direction.

Further features of the present invention will become apparent from the following description of exemplary embodiments (with reference to the attached drawings).

DESCRIPTION OF THE EMBODIMENTS

Figure 1A:
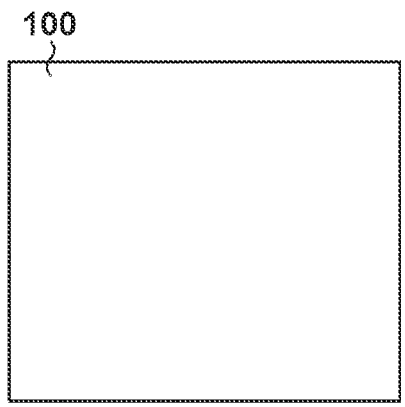
FIGS. 1A to 1F are views for explaining a method of manufacturing a ceramic package according to some embodiments.

Embodiments of the present invention will be described with reference to the accompanying drawings. The same reference numerals denote the same elements throughout various embodiments, and a repetitive description thereof will be omitted. The embodiments can appropriately be modified or combined.

First Embodiment

A method of manufacturing a ceramic package according to the first embodiment will be described with reference to FIGS. 1A to 4. The ceramic package is used to mount an electronic device such as a semiconductor chip. As will be described later, the ceramic package manufactured by the method below includes a plurality of connecting portions on its side surfaces. These connecting portions are used to joint the ceramic package to a mounting board with solder.

First, a plurality of ceramic green sheets 100 shown in FIG. 1A are prepared. Each ceramic green sheet 100 is formed by, for example, mixing a power of a ceramic material into a binder and molding this binder into a sheet.

Silicon carbide, aluminum nitride, sapphire, alumina, silicon nitride, cermet, yttria, mullite, forsterite, cordierite, zirconia, steatite, or the like may be used as the ceramic material.

Figure 1B:
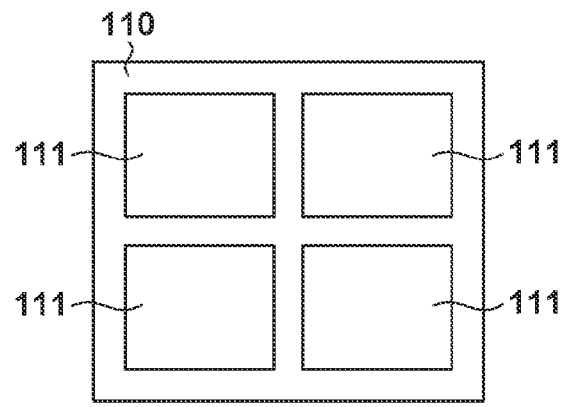
Figure 1C:
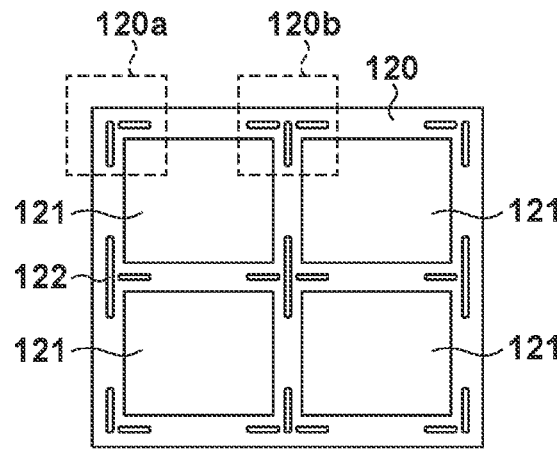
Figure 1D:
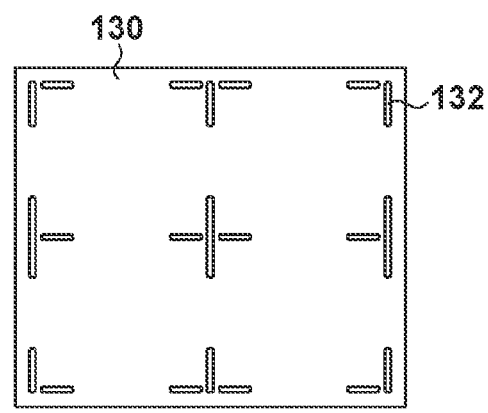

Then, ceramic green sheets 110, 120, and 130 which are, respectively, shown in FIGS. 1B to 1D are formed as many as needed by processing the plurality of ceramic green sheets 100, respectively. The ceramic green sheets 110 are formed by forming holes 111 in the ceramic green sheets 100. Each hole 111 is formed by, for example, punching using a die. Each hole 111 has a rectangular shape and extends through the ceramic green sheet 110. In FIG. 1B, the ceramic green sheet 110 has four holes 111. As will be described later, the holes 111 constitute some cavities for the package to contain the electronic device. Therefore, the ceramic green sheets 110 have the holes 111 corresponding to the number of ceramic packages manufactured by using the ceramic green sheets 110. If the ceramic green sheets 110 have the plurality of holes 111, all of them may have the same shape and size or different shapes and sizes.

The ceramic green sheets 120 are formed by forming holes 121 and holes 122 in the ceramic green sheets 100. The holes 121 and 122 are formed by, for example, punching by using a die. The holes 121 are positioned so as to overlap the holes 111 completely or partially when the ceramic green sheets 110 and the ceramic green sheets 120 are superimposed on each other. The holes 121 and the holes 111 may be the same or different in shape and size. As will be described later, the holes 121 constitute some cavities for the package to contain the electronic device.

As will be described later, the holes 122 are used to form connecting portions on the side surfaces of the ceramic package. In FIG. 1C, each reference numeral denotes only one hole 122 but out of holes in the ceramic green sheet 120, all the holes other than four holes 121 are the holes 122. The ceramic green sheet 120 has 21 holes 122 in total, that is, two holes at each of four corners, two holes on each of the left and right in the center, three holes at each of the top and bottom in the center, and three holes in the center. Each hole 122 has a long, narrow shape and extends through the ceramic green sheet 120. The long, narrow shape is a shape, for example, having a length three times or more than a width. Instead of this, each hole 122 may have another shape such as a circle or a square.

Figure 1E:
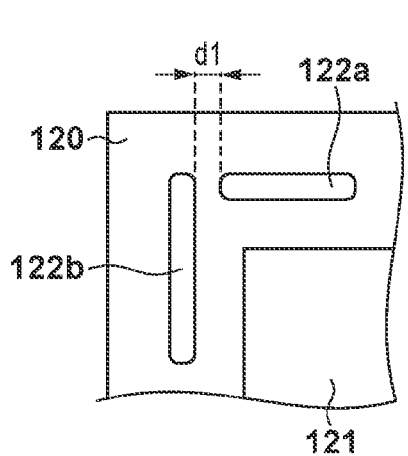
Figure 1F:
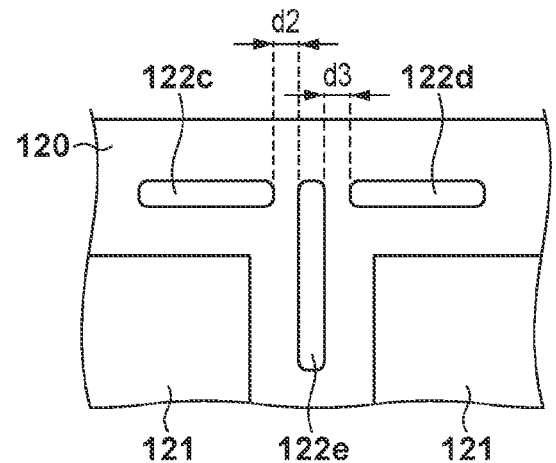

The holes 122 will be described in detail with reference to FIGS. 1E and 1F. FIG. 1E is an enlarged view showing a portion 120a of the ceramic green sheet 120. FIG. 1F is an enlarged view showing a portion 120b of the ceramic green sheet 120. In FIGS. 1E and 1F, a to e are added after the reference numerals in order to discriminate the plurality of holes 122.

As shown in FIG. 1E, a hole 122a and a hole 122b are arranged so as be to adjacent to each other. With such an arrangement, it is possible to make the connecting portion formed by using the hole 122a and the connecting portion formed by using the hole 122b adjacent to each other, as will be described later. The hole 122a and the hole 122b extend in directions crossing each other, or in directions perpendicular to each other in an example of FIG. 1E. In FIG. 1E, the extension of the hole 122a passes through the hole 122b. Instead of this, the extension of the hole 122a may not pass through the hole 122b. The hole 122a and the hole 122b are arranged at a distance of d1. In this specification, a distance between two elements is the minimum length of a line segment joining one point in one element and one point in the other element.

As shown in FIG. 1F, a hole 122e is arranged so as to be adjacent to a hole 122c and a hole 122d. In a description below, both the relationship between the hole 122e and the hole 122c, and the relationship between the hole 122e and the hole 122d are the same as the relationship between the hole 122a and the hole 122b described above. The hole 122e and the hole 122c are arranged at a distance of d2. The hole 122e and the hole 122d are arranged at a distance of d3. All the distances d1 to d3 may have the same value or different values. In order to suppress damage to the ceramic green sheet 120, the distances d1 to d3, respectively, on the ceramic green sheet 120 may be larger than the thickness of the ceramic green sheet 120. Instead of this, the distances d1 to d3 on the ceramic green sheet 120 may be equal to or smaller than the thickness of the ceramic green sheet 120.

The ceramic green sheets 130 are formed by forming holes 132 in the ceramic green sheets 100. The holes 132 are formed by, for example, punching by using a die. The holes 132 are positioned so as to overlap the holes 122 completely or partially when the ceramic green sheets 120 and the ceramic green sheets 130 are superimposed on each other. The holes 132 and the holes 122 may be the same or different in shape and size.

The ceramic green sheets 100, 110, 120, and 130 may further have through holes (not shown) for forming plugs connecting wiring patterns to each other which are formed on the different ceramic green sheets. Circuit wirings are formed by wiring patterns and the plugs. The circuit wirings are used to electrically connect the electronic device mounted on the ceramic package and the bottom terminal of the ceramic package. The through holes may be formed by punching using the die simultaneously with the holes described above. The diameter of each through hole may be, for example, from 0.05 mm (inclusive) to 1 mm (inclusive). The ceramic green sheets 100, 110, 120, and 130 may further have holes used to form cavities for containing small components such as chip capacitors and chip resistors.

Figure 2A:
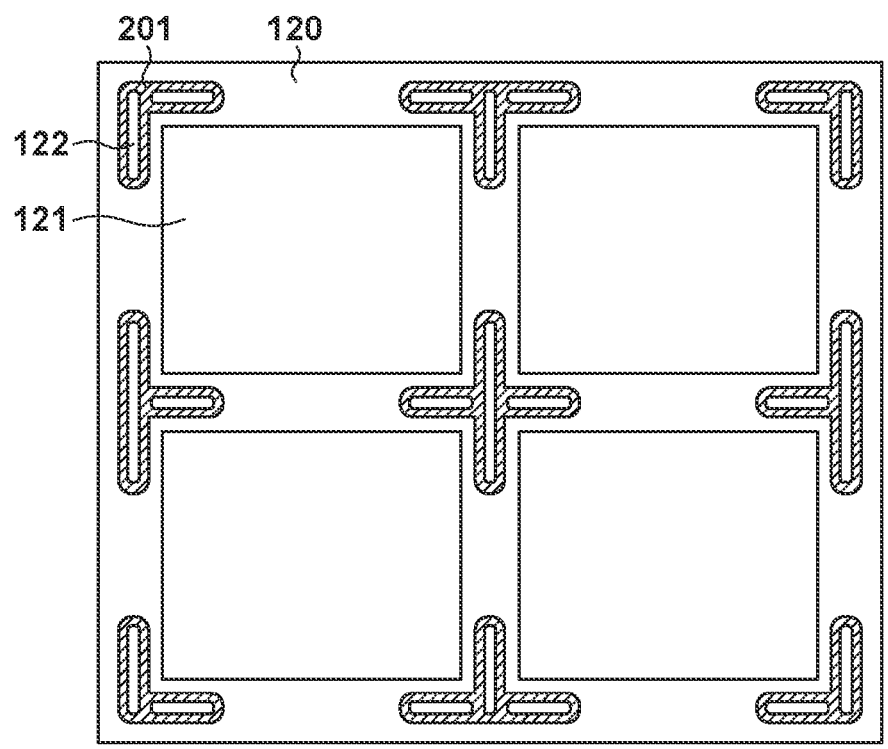
FIGS. 2A and 2B are views for explaining the method of manufacturing the ceramic package according to some embodiments.

Then, as shown in FIG. 2A, an electrically conductive paste 201 is applied and dried around the holes 122 in one surface of the ceramic green sheet 120. In FIG. 2A, each reference numeral is denoted only the electrically conductive paste at one spot. However, the electrically conductive paste 201 is applied at nine spots. Application is performed by, for example, screen printing. In a combination with a material for the ceramic green sheet, a material which hardly disconnects a wiring by the electrically conductive paste 201 when burning to be described later is used for the electrically conductive paste 201. As the material for such an electrically conductive paste 201, there is, for example, a material obtained by mixing a tungsten filler into a binder. Instead of this, the material for the electrically conductive paste 201 may be obtained by mixing copper, silver, gold, nickel, molybdenum, titanium, or a combination of these into the binder.

After the electrically conductive paste 201 is applied to one surface of the ceramic green sheet 120, the electrically conductive paste 201 partially remains on the holes 122. This remaining electrically conductive paste 201 is sucked, through the holes 122, from the opposite surface of the ceramic green sheet 120. With this suction, the remaining electrically conductive paste 201 is removed, and the electrically conductive paste 201 is applied to the inside of each of the plurality of holes 122. In order to coat the inside of each hole 122 with the electrically conductive paste 201 even if a positional shift occurs on a printing plate for printing the electrically conductive paste 201, the printing pattern of the electrically conductive paste 201 may have a size larger than the circumference of the hole 122.

Figure 2B:
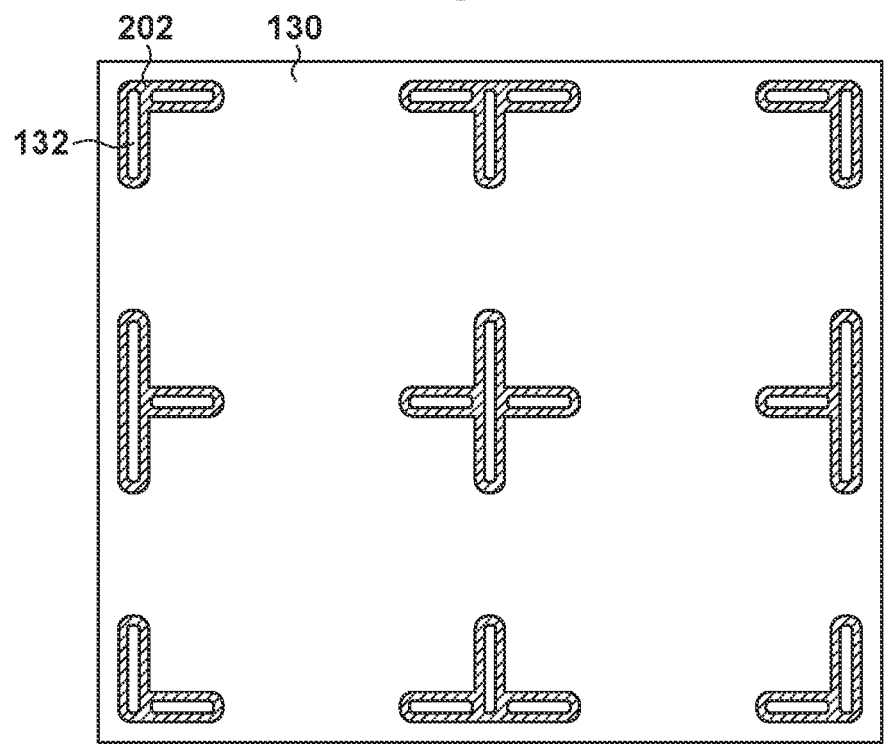

As shown in FIG. 2B, like the ceramic green sheet 120, an electrically conductive paste 202 is applied around the holes 132 in one surface of the ceramic green sheet 130, and the electrically conductive paste 202 is applied to the inside of each of the plurality of holes 132. The printing pattern of the electrically conductive paste 202 may be the same as or different from the printing pattern of the electrically conductive paste 201. If the ceramic green sheets 100, 110, 120, and 130 have the through holes (not shown) for forming the plugs, the electrically conductive paste may be applied to the inside of each of these through holes simultaneously with the inside of each of the other holes. Wiring patterns are further formed on the surfaces of the ceramic green sheets 100, 110, 120, and 130.

Figure 3:
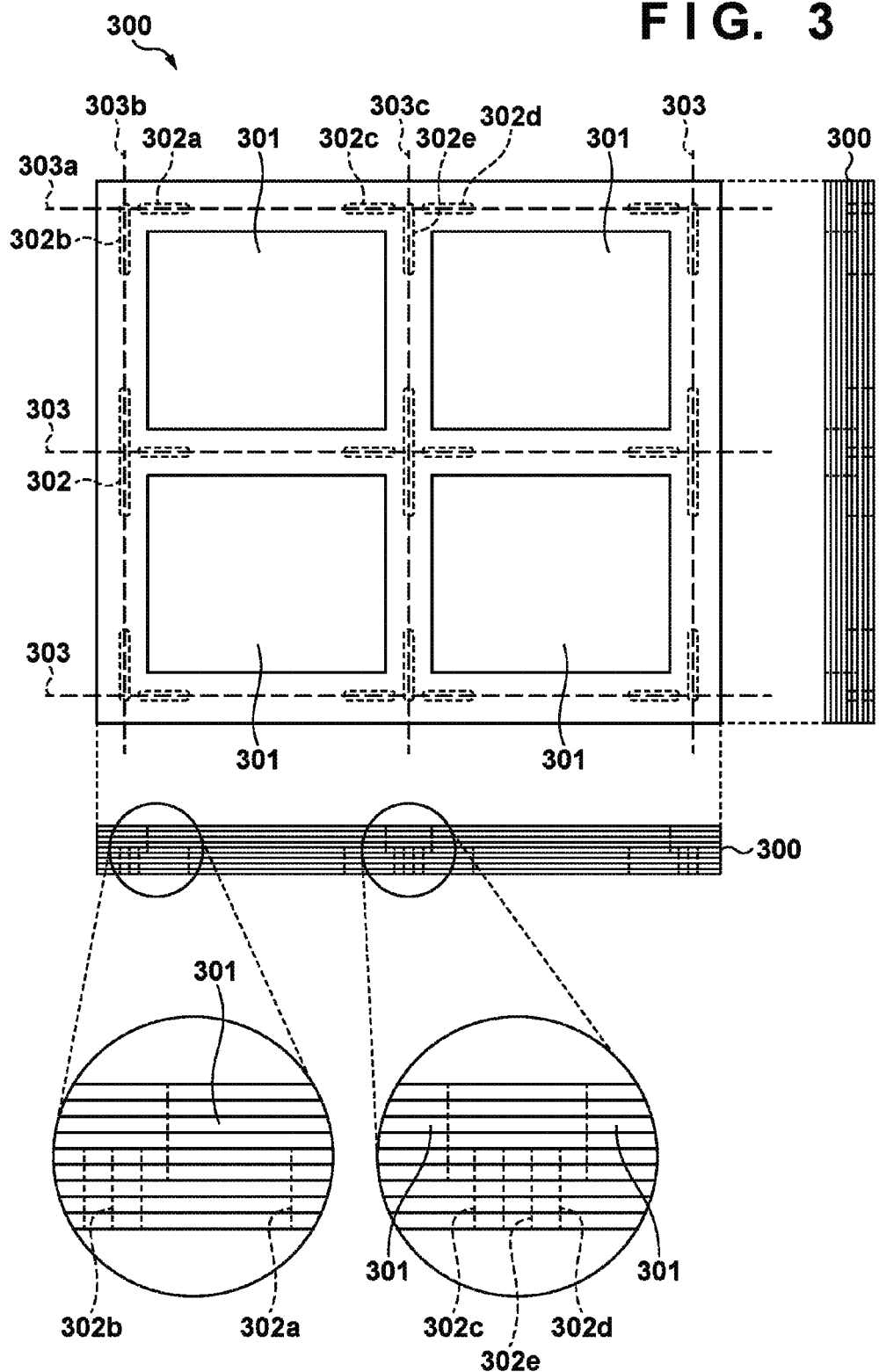
FIG. 3 shows views for explaining the method of manufacturing the ceramic package according to some embodiments.

Then, as shown in FIG. 3, a ceramic member 300 is formed by using one or more of the ceramic green sheets 100, 110, 120, and 130. If the ceramic member 300 is formed by one ceramic green sheet, the ceramic green sheet 120 having the holes 122 or the ceramic green sheet 130 having the holes 132 is used. If the ceramic member 300 is formed by the plurality of ceramic green sheets, the plurality of ceramic green sheets including one or more of the ceramic green sheets 120 or the ceramic green sheets 130 are used. If the ceramic green sheet 120 is used to form the ceramic member 300, the ceramic green sheet 120 having the holes 122 each inside of which has been coated with the electrically conductive paste 201 is used. The same also applies to the ceramic green sheet 130.

In an example of FIG. 3, the ceramic member 300 is formed by stacking four ceramic green sheets 110, two ceramic green sheets 120, and three ceramic green sheets 130 in this order from the top. In FIG. 3, an upper left view is a plan view showing the ceramic member 300, a lower left view is a front view showing the ceramic member 300, and a right view is a side view showing the ceramic member 300. Enlarged views showing two spots in the front view are also shown.

As in FIG. 3, when the plurality of ceramic green sheets are stacked, they are aligned with each other such that the holes 111 and the holes 121 overlap, and the holes 122 and the holes 132 overlap. Alignment is performed by, for example, providing a plurality of circular holes (not shown) at positions corresponding to all the ceramic green sheets and inserting metal pins into them. Then, an appropriate load is applied to the ceramic member 300 from above, preventing gaps from being made between the ceramic green sheets. Subsequently, the plurality of ceramic green sheets are coupled to each other by burning the ceramic member 300 in a burning furnace, forming the integrated ceramic member 300. With this burning, the electrically conductive pastes 201 and 202 are also burned, and electrically conductive members are formed in the ceramic member 300. The ceramic member 300 shrinks by about 10% to 15% by burning. Accordingly, each of the distances d1 to d3 after burning becomes about 85% to 90% of its size before burning.

The ceramic member 300 has cavities 301 formed by connecting the holes 111 and 121 in one or more of the ceramic green sheets 110 and 120. The ceramic member 300 further includes electrically conductive members 302 formed by drying the electrically conductive paste applied to the inside of each of the holes 122 and 132 in one or more of the ceramic green sheets 120 and 130. In FIG. 3, "a" to "e" are added after the reference numerals of some of the electrically conductive members 302 in order to discriminate the plurality of electrically conductive members 302. The reference numerals for some of the electrically conductive members 302 will not be given.

The electrically conductive members 302 pass through the holes 122 of the ceramic green sheets 120 and the holes 132 of the ceramic green sheets 130. For example, the electrically conductive members 302a to 302e pass through the holes 122a to 122e, respectively. Each electrically conductive member 302 has a hollow structure, and covers the inner surfaces of the ceramic member 300 facing the holes 122 and 132. Some (four on the upper side) of the ceramic green sheets forming the ceramic member 300 do not have the holes 122 and 132 for forming the connecting portions. Therefore, in the example of FIG. 3, the electrically conductive members 302 do not extend through the ceramic member 300. Instead of this, the ceramic member 300 may be formed by combining only the ceramic green sheets 120 and 130 such that the electrically conductive members 302 extend through the ceramic member 300. The electrically conductive members 302 adhere to the inner surfaces of the holes through which they pass, and thus the distance between two electrically conductive members 302 adjacent to each other is equal to the distance between two holes through which they pass. For example, the distance between the electrically conductive member 302a and the electrically conductive member 302b is equal to the distance d1 between the hole 122a and the hole 122b after burning.

The depth of each cavity 301 is adjusted by the number of ceramic green sheets 110 and 120 used to form the ceramic member 300. The cavities 301 in FIG. 3 have the same area regardless of their depths. Instead of this, steps may be formed on the side surfaces of the cavities 301. For example, when the cavities 301 contain the semiconductor chips, electrodes for providing stitch bonding of wire bonding may be arranged in the steps on the side surfaces of the cavities 301. The steps on the side surfaces of the cavities 301 are formed by forming the ceramic member 300 by using a plurality of types of ceramic green sheets 110 and 120 different in size of the holes 111 and 121.

Figure 4:
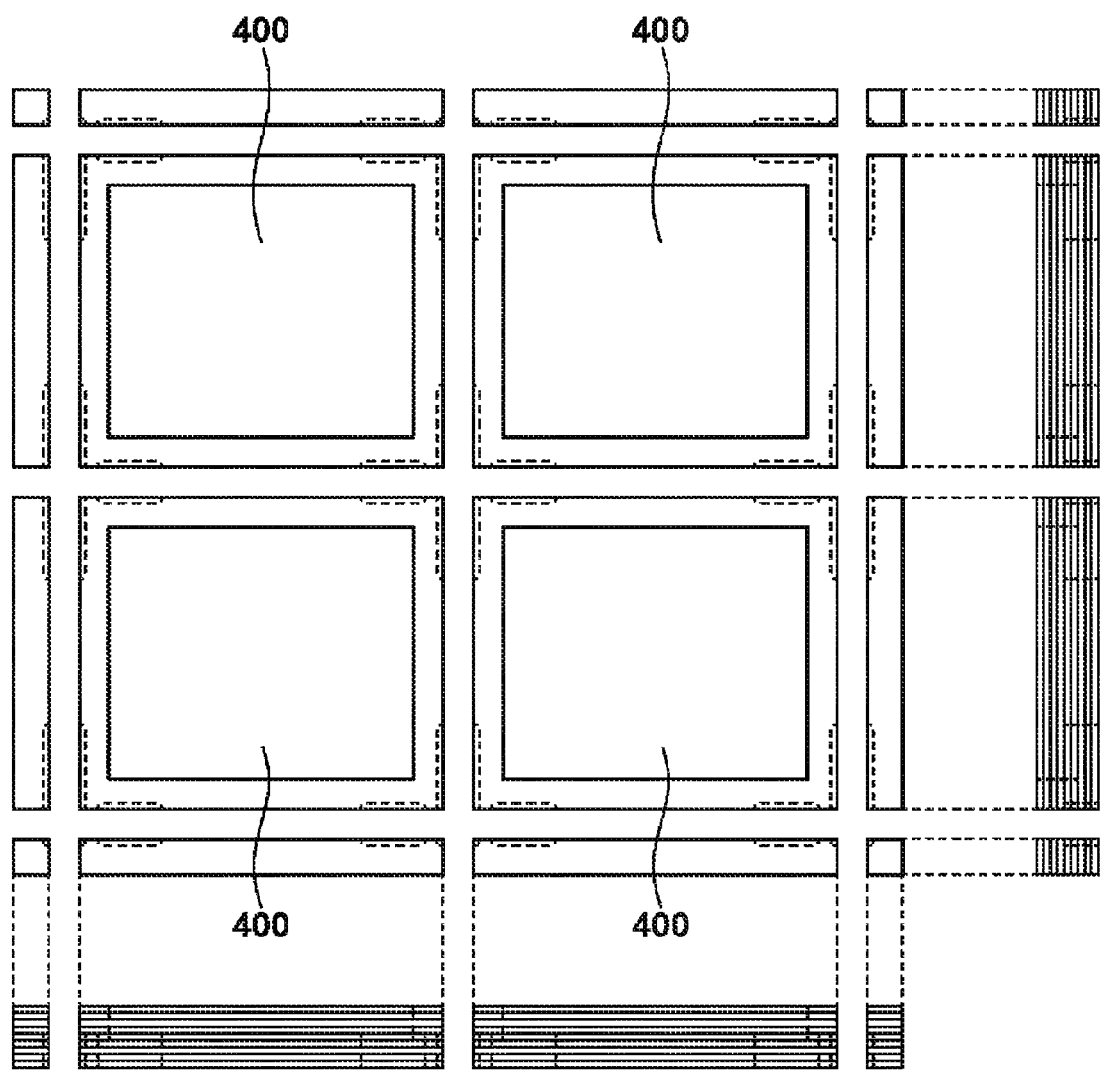
FIG. 4 is a view for explaining the method of manufacturing the ceramic package according to some embodiments.

Then, ceramic packages 400 are formed from the ceramic member 300 by dividing the ceramic member 300 by planes 303 passing through the holes 122 and 132. The planes 303 are illustrated as lines in the plan view of FIG. 3. FIG. 4 shows the divided ceramic member 300. In FIG. 3, "a" to "c" are added after the reference numerals of some of the planes 303 in order to discriminate the plurality of planes 303. The side surfaces of the ceramic packages 400 appear by dividing the ceramic member 300. As shown in FIG. 3, the ceramic member 300 is divided by six planes 303. All the six planes 303 pass through the electrically conductive members 302. However, the ceramic member 300 may be divided by planes that do not pass through the electrically conductive members 302. For example, when some of the side surfaces of the ceramic packages 400 do not include the connecting portions, the ceramic member 300 is divided by the planes that do not pass through the electrically conductive members 302.

When one ceramic package 400 is formed from one ceramic member 300, an unnecessary portion on the periphery of the ceramic package 400 is removed by dividing the ceramic member 300. When the plurality of ceramic packages 400 are formed from one ceramic member 300, the ceramic packages 400 are separated from each other by dividing the ceramic member 300, and unnecessary portions on the periphery of them are removed. Then, the ceramic packages 400 are completed through steps such as the leak check of the cavities 301, the disconnection check of the wirings, cleaning, and the like.

The ceramic member 300 is divided by, for example, the following method. First, before the ceramic member 300 is burned, snaps (not shown), that is, V-shaped grooves are formed along the planes 303 on the respective ceramic green sheets which form the upper surface and the bottom surface of the ceramic member 300. Then, the ceramic member 300 is divided along the snaps. Before the ceramic member 300 is divided, a plating process may be performed on the electrically conductive members 302 with a metal such as nickel, gold, palladium, or the like.

The planes 303 pass through the electrically conductive members 302. Therefore, the electrically conductive members 302 are also divided by dividing the ceramic member 300. For example, four electrically conductive members 302 including the electrically conductive members 302a, 302c, and 302d are divided by dividing the ceramic member 300 by a plane 303a. Three electrically conductive members 302 including the electrically conductive member 302b are divided by dividing the ceramic member 300 by a plane 303b. Three electrically conductive members 302 including the electrically conductive member 302e are divided by dividing the ceramic member 300 by a plane 303c. Each portion of the divided electrically conductive members 302 is positioned on the side surface of the ceramic package 400 that appears by dividing the ceramic member 300 and becomes the connecting portion. In the above-described manufacturing method, the ceramic member 300 is divided after burning. Instead of this, however, burning to couple the ceramic sheets may be performed after dividing the ceramic member 300. In this case, the electrically conductive paste may be dried before dividing the ceramic member 300.

Figure 5A:
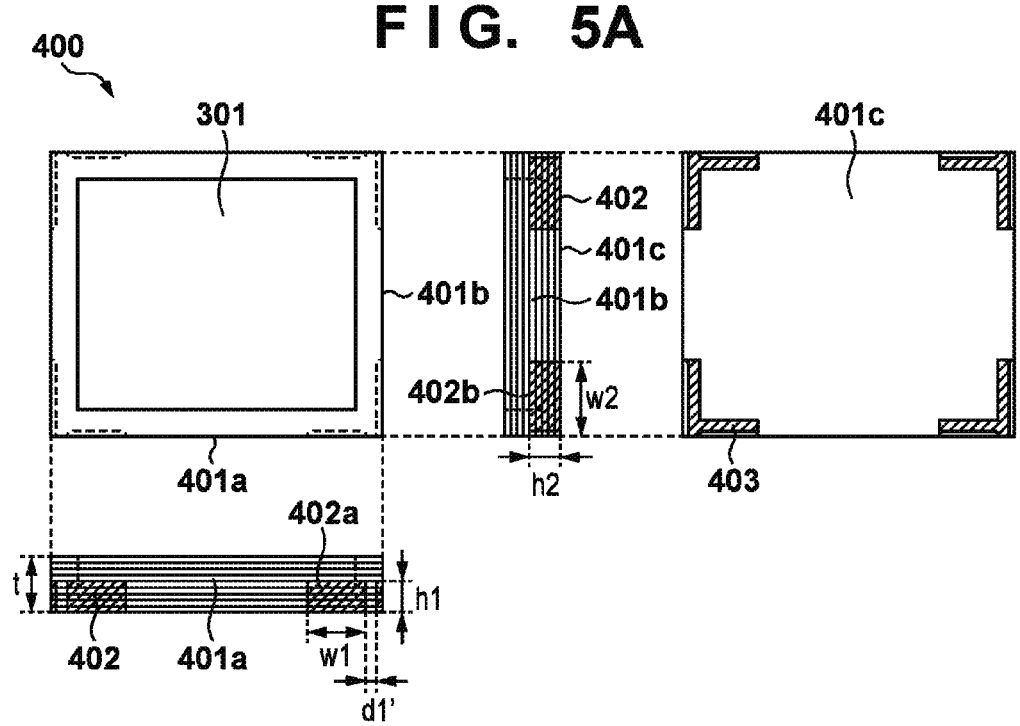
FIGS. 5A and 5B are views for explaining the ceramic package and an electronic component according to some embodiments.

The ceramic package 400 manufactured by the above-described method will be described with reference to FIG. 5A. In FIG. 5A, an upper left is a plan view showing the ceramic package 400, a lower left view is a front view showing the ceramic package 400, an upper center view is a side view showing the ceramic package 400, and an upper right view is a bottom view showing the ceramic package 400. The front view and the side view, respectively, show the different side surfaces of the ceramic package 400.

The ceramic package 400 has a rectangular shape with four side surfaces made of two pairs of side surfaces facing each other. Four side surfaces include two side surfaces 401a and 401b adjacent to each other. The ceramic package 400 further has a bottom surface 401c. As described above, the ceramic package 400 has the cavity 301 which is open upward.

Figure 5B:
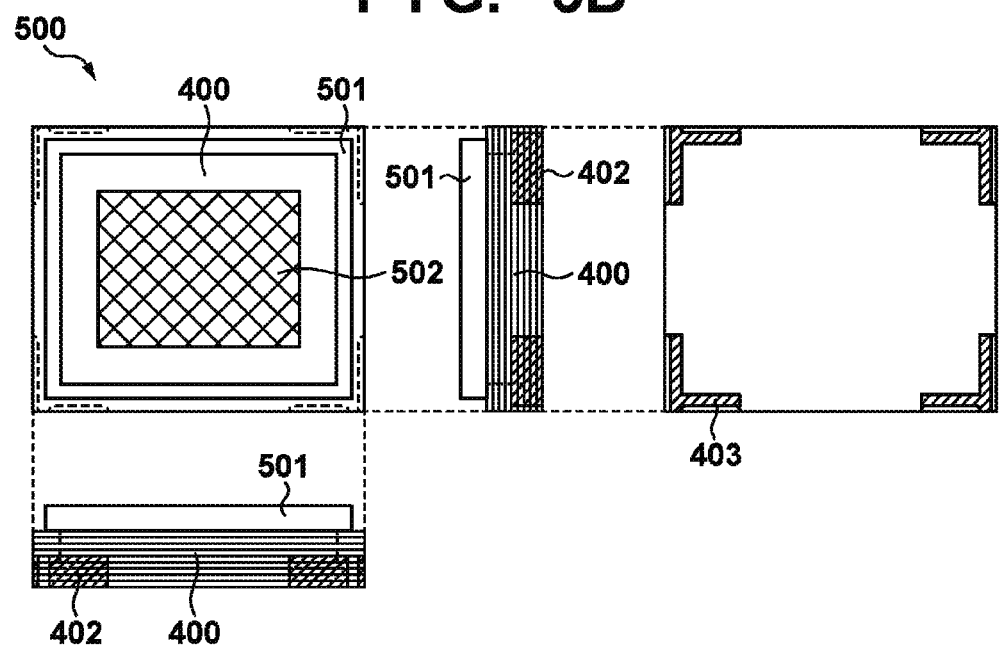

Each side surface of the ceramic package 400 includes two connecting portions 402. In FIGS. 5A and 5B, "a" and "b" are added after the reference numerals of some of the connecting portions 402 in order to discriminate the plurality of connecting portions 402. Each connecting portion 402 is one of a plurality of portions obtained by dividing the electrically conductive members 302 formed in the ceramic member 300 by the planes 303. For example, a connecting portion 402a is a part of the electrically conductive member 302a, and a connecting portion 402b is a part of the electrically conductive member 302b. Note that FIG. 4 shows a state in which an upper left package board obtained by dividing the ceramic member 300 of FIG. 3 is rotated through 180°, for a descriptive purpose. A distance between the connecting portion 402a and the connecting portion 402b is indicated by d1'. The connecting portion 402a is the part of the electrically conductive member 302a, and the connecting portion 402b is the part of the electrically conductive member 302b. Accordingly, the distance d1' between the connecting portion 402a and the connecting portion 402b corresponds to the distance d1 between the electrically conductive member 302a and the electrically conductive member 302b.

The length of each connecting portion 402 in a direction parallel to both the side surface on which the connecting portion 402 is arranged and the bottom surface 401c of the ceramic package 400 will be referred to as the width of the connecting portion 402 hereinafter. It can also be said that the width of each connecting portion 402 is the length of the connecting portion 402 in a longitudinal direction of the side surface on which the connecting portion 402 is arranged. Instead of this, it can also be said that the width of each connecting portion 402 is the length of the connecting portion 402 along a side between the bottom surface 401c and the side surface on which the connecting portion 402 is arranged. The length of each connecting portion 402 in a direction perpendicular to the bottom surface 401c of the ceramic packages 400 will be referred to as the height of the connecting portion 402. It can also be said that the height of each connecting portion 402 is referred to as the length of the connecting portion 402 in a widthwise direction of the side surface on which the connecting portion 402 is arranged. Instead of this, it can also be said that the height of each connecting portion 402 is the length of the connecting portion 402 along a side between the side surface on which the connecting portion 402 is arranged and the side surface adjacent to this. Each connecting portion 402 has an oblong shape with the width of the connecting portion 402 larger than the height of the connecting portion 402. For example, a width w1 of the connecting portion 402a is larger than a height h1 of the connecting portion 402a. Similarly, a width w2 of the connecting portion 402b is larger than a height h2 of the connecting portion 402b.

The distance between two connecting portions 402 adjacent to each other is smaller than the width of at least one of these connecting portions 402. For example, the distance d1' between the connecting portion 402a and the connecting portion 402b is smaller than at least one of the width w1 of the connecting portion 402a and the width w2 of the connecting portion 402b. Further, the distance between two connecting portions 402 adjacent to each other may be smaller than each of the widths of these connecting portions 402. Also, the distance of two connecting portions 402 adjacent to each other may be smaller than the thickness of the ceramic member 300 after burning, that is, a thickness t of the ceramic package 400. Furthermore, the distance of two connecting portions 402 adjacent to each other may be smaller than each of the heights of these two connecting portions.

The ceramic package 400 may further include connecting portions 403 for solder joint on the bottom surface 401c. The coupling strength between the ceramic package 400 and the mounting board is further increased by jointing the connecting portions 403 to the mounting board with solder. Each connecting portion 403 may electrically be connected to a corresponding one of the wirings of the ceramic package 400 so as to function as a signal terminal, a ground terminal, or a power supply terminal. The ceramic package 400 may further include a plurality of terminals (not shown) on the bottom surface 401c. The terminals on the bottom surface 401c may form a land grid array in which circular terminals are arranged at grid points or may form a leadless chip carrier in which the plurality of terminals are aligned along four sides of the bottom surface 401c. The terminals on the bottom surface 401c may be probing terminals or may also be used for solder joint.

An electronic component 500 using the above-described ceramic package 400 will be described with reference to FIG. 5B. In FIG. 5B, an upper left view is a plan view showing the electronic component 500, a lower left view is a front view showing the electronic component 500, an upper center view is a side view showing the electronic component 500, and an upper right view is a bottom view showing the electronic component 500. The electronic component 500 includes the ceramic package 400, a cover 501, and an electronic device 502.

The electronic device 502 is mounted on the ceramic package 400. In an example of FIG. 5B, the electronic device 502 is contained in the cavity 301 of the ceramic package 400. The cover 501 is coupled to the upper surface of the ceramic package 400 so as to seal the electronic device 502 in the cavity 301. If the electronic device 502 is an image capturing apparatus, the cover 501 is made of a transparent material. The connecting portions 402 and 403 of the ceramic package 400 are continuously utilized as connecting portions of the electronic component 500.

Figure 6A:
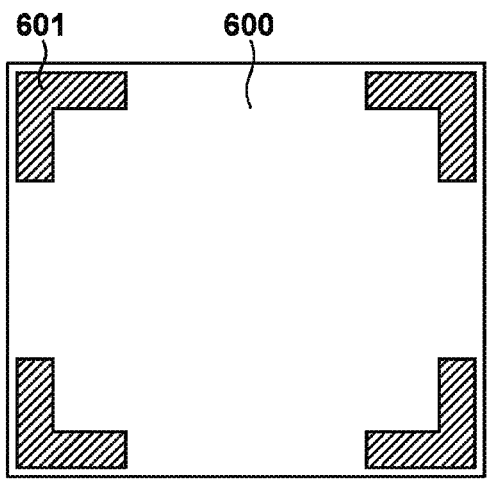
FIGS. 6A and 6B are views for explaining a module according to some embodiments.

A mounting board 600 on which the electronic component 500 is mounted will be described with reference to FIG. 6A. FIG. 6A shows a surface of the mounting board 600 on a side facing the electronic component 500. The mounting board 600 is, for example, a printed circuit board such as a double-sided board or a buildup circuit board. The mounting board 600 includes a prepreg made of a glass fiber, an epoxy resin, a BT resin, or the like and a wiring pattern made of a copper foil or the like. The mounting board 600 includes connecting portions 601. The connecting portions 601 are jointed with solder to the connecting portions 402 and 403 of the electronic component 500 mounted on the mounting board 600.

Figure 6B:
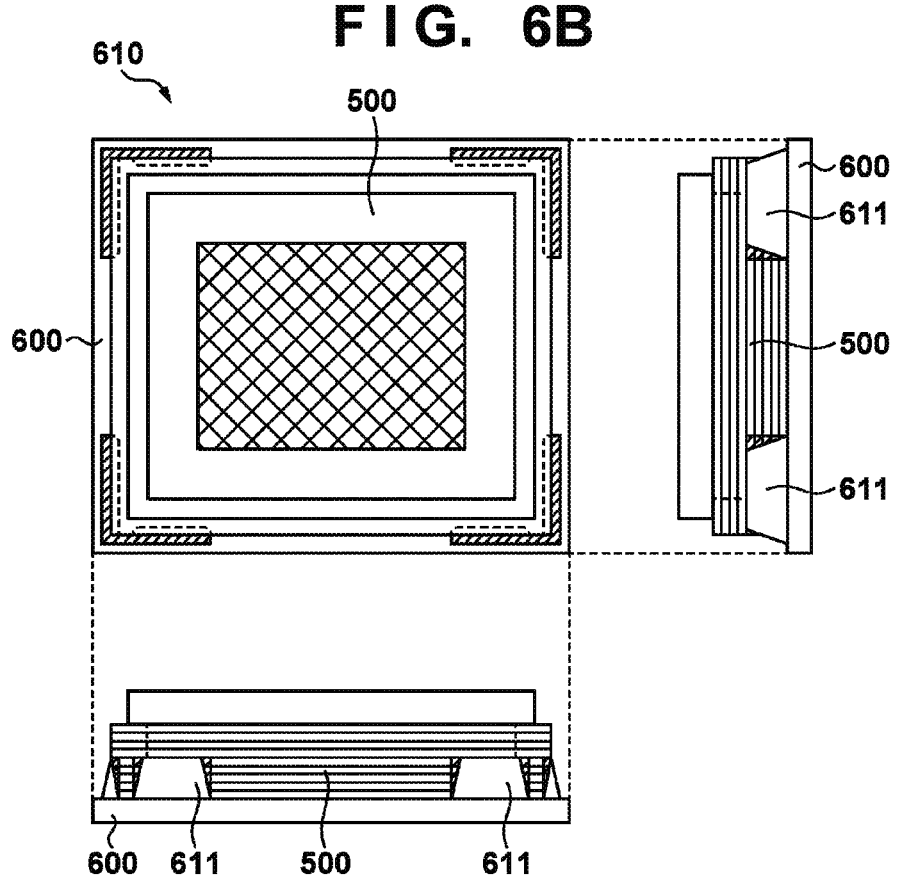

A module 610 formed by mounting the electronic component 500 on the mounting board 600 will be described with reference to FIG. 6B. In FIG. 6B, an upper left view is a plan view showing the module 610, a lower left view is a front view showing the module 610, and an upper right view is a side view showing the module 610. In the module 610, the connecting portions 601 of the mounting board 600, and the connecting portions 402 and 403 of the electronic component 500 are jointed to each other with solder 611. The solder 611 wets and spreads to the connecting portions 402 on the side surfaces of the electronic component 500, and each surface of the solder 611 forms a meniscus. This solder 611 firmly couples the electronic component 500 and the mounting board 600 to each other. Besides the electronic component 500, a surface mount capacitor, resistor, electric component (all of which are not shown), or the like are mounted on the mounting board 600.

The linear expansion coefficient of the mounting board 600 is generally larger than that of each ceramic package 400. Owing to this difference in linear expansion coefficient, a large stress is applied to the joint between the electronic component 500 and the mounting board 600 by, for example, a temperature change in the module 610. The stress reaches its peak near four corners of the electronic component 500. It is therefore possible, by arranging the solder 611 near four corners of the electronic component 500 as shown in FIG. 6B, to reduce the stress applied to coupling between the mounting board 600 and the terminals on the bottom surface of the electronic component 500. If the distance between two connecting portions 402 adjacent to each other near the corners of the electronic component 500 is short, the distance between each connecting portion 402 and a corresponding one of the corners of the electronic component 500 also becomes short accordingly.

Comparative Example

Figure 7A:
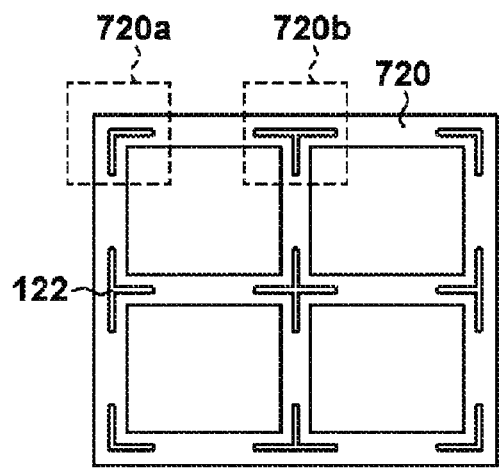
FIGS. 7A to 7D are views for explaining a method of manufacturing a ceramic package according to a comparative example.
Figure 7B:
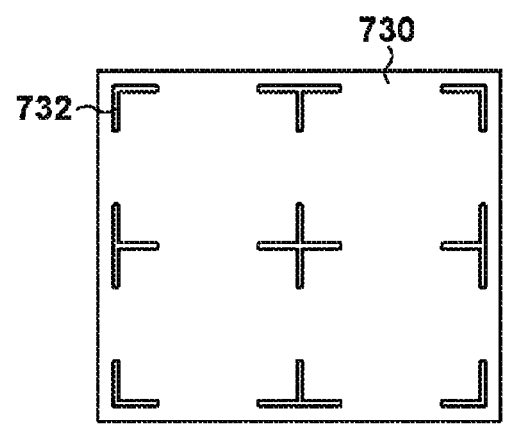
Figure 7C:
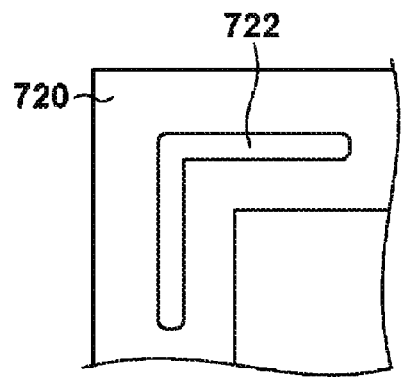
Figure 7D:
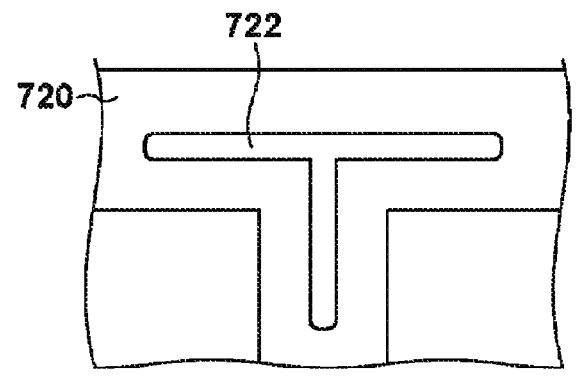

Then, a ceramic package of a comparative example will be described with reference to FIGS. 7A to 7D. The ceramic package of the comparative example is formed by using a ceramic green sheet 720 of FIG. 7A instead of a ceramic green sheet 120 and using a ceramic green sheet 730 of FIG. 7B instead of a ceramic green sheet 130. FIG. 7C is an enlarged view showing a portion 720a of the ceramic green sheet 720. FIG. 7D is an enlarged view showing a portion 720b of the ceramic green sheet 720. The ceramic green sheet 720 is different from the ceramic green sheet 120 in that it has holes 722 instead of holes 122. The ceramic green sheet 730 is different from the ceramic green sheet 130 in that it has holes 732 instead of holes 132. Thus, while two holes 122 adjacent to each other are formed near one corner of the ceramic package 400 in the first embodiment, one hole 722 is formed near one corner of the ceramic package in the comparative example. Therefore, if a connecting portion having a similar size to that in the first embodiment is to be formed in the comparative example, the size of one hole 722 increases accordingly. Consequently, in the ceramic green sheet 720, a play near each hole 722 is large, deforming the ceramic green sheet 720 more easily than the ceramic green sheet 120. Accordingly, the ceramic green sheet 720 may be damaged, or a wiring formed on the ceramic green sheet 720 may be disconnected. The same also applies to the ceramic green sheet 730. On the other hand, in the first embodiment, the coupling strength between the electronic component 500 and the mounting board 600 can be improved while suppressing an increase in size of each hole 122 for forming a corresponding one of the connecting portions 402 and suppressing deformation in the ceramic green sheet by the suppression of the size increase of the hole 122.

In the above-described example, two holes 122 adjacent to each other extend in directions crossing each other. However, each ceramic green sheet 120 may have two holes 122 adjacent to each other and extending in the same direction (for example, on one straight line). It is possible, by forming the connecting portions with these holes 122, to form two connecting portions adjacent to each other on the same side surface of each ceramic package 400. The distance between these two connecting portions may also satisfy the same condition as the above-described distance d1'.

Then, an experimental result in an example of the first embodiment will be described. The ceramic packages 400 of the example were manufactured on the following conditions. First, each ceramic green sheet 100 after burning had the size of 11.6 mm×13.6 mm and the thickness of 0.25 mm. As described above, each ceramic package 400 having the thickness t of 2.25 mm was formed by forming the ceramic member 300 by stacking nine ceramic green sheets. All the distances d1 to d3 between two holes 122 adjacent to each other after burning were 0.5 mm. Accordingly, the distance between two connecting portions 402 adjacent to each other was also 0.5 mm. The connecting portion 402a had the width w1 of 2.4 mm and the height h1 of 1.25 mm. The connecting portion 402b had the width w2 of 2.9 mm and the height h2 of 1.25 mm. Each ceramic package 400 manufactured on these conditions had the structure described in the comparative example, and occurrence of a failure caused by deforming the ceramic green sheets was suppressed as compared with a ceramic package manufactured on the same condition. A desired life was obtained by making a prediction about the life of a wear-out failure in the solder 611 of the module on which the ceramic packages 400 manufactured on these conditions were mounted.

Second Embodiment

Figure 8A:
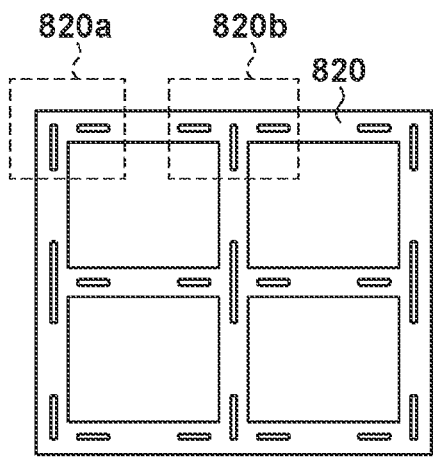
FIGS. 8A to 8D are views for explaining a method of manufacturing a ceramic package according to some embodiments.
Figure 8B:
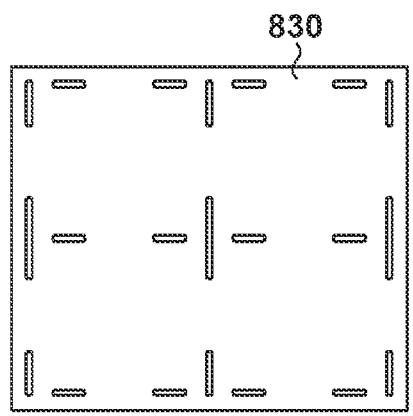
Figure 8C:
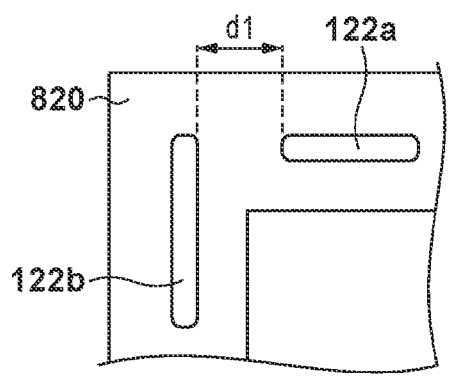
Figure 8D:
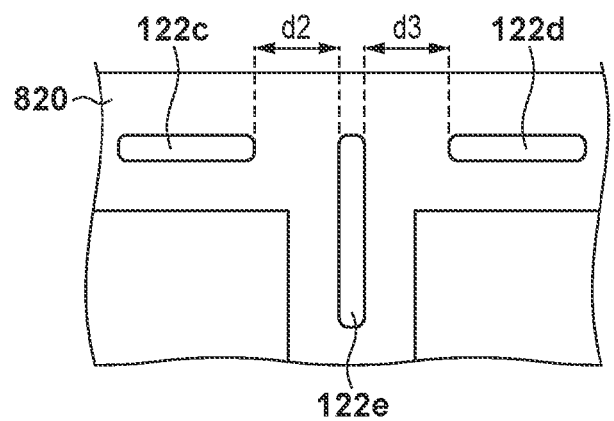

A method of manufacturing a ceramic package according to the second embodiment will be described with reference to FIGS. 8A to 8D. In the method of manufacturing the ceramic package of the second embodiment, a ceramic green sheet 820 of FIG. 8A is used instead of a ceramic green sheet 120, and a ceramic green sheet 830 of FIG. 8B is used instead of a ceramic green sheet 130. FIG. 8C is an enlarged view showing a portion 820a of the ceramic green sheet 820. FIG. 8D is an enlarged view showing a portion 820b of the ceramic green sheet 820.

In the second embodiment, the distance between two holes 122 adjacent to each other of the ceramic green sheet 820 is larger than in the first embodiment. As a result, the distance between two connecting portions 402a and 402b adjacent to each other is, for example, larger than each of a height h1 of the connecting portion 402a and a height h2 of the connecting portion 402b, and smaller than at least one of a width w1 of the connecting portion 402a and a width w2 of the connecting portion 402b.

Then, an experimental result in an example of the second embodiment will be described. The ceramic package of the example was manufactured on the following conditions. First, each ceramic green sheet 100 after burning had the size of 11.6 mm×13.6 mm and the thickness of 0.25 mm. As described above, ceramic packages 400 each having a thickness t of 2.25 mm were formed by forming a ceramic member 300 by stacking nine ceramic green sheets. All distances d1 to d3 between two holes 122 adjacent to each other after burning were 1.5 mm. Accordingly, the distance between two connecting portions 402 adjacent to each other was also 1.5 mm. The connecting portion 402a had the width w1 of 2.4 mm and the height h1 of 1.25 mm. The connecting portion 402b had the width w2 of 2.9 mm and the height h2 of 1.25 mm. The ceramic package manufactured on these conditions had the structure described in the comparative example, and occurrence of a failure caused by deforming the ceramic green sheets was suppressed as compared with a ceramic package manufactured on the same condition. A desired life was obtained by making a prediction about the life of a wear-out failure in solder 611 of a module on which the ceramic package manufactured on these conditions was mounted.

The prediction about the life of the wear-out failure in the solder 611 of a module in the second embodiment tended to be shorter than that of the solder 611 of the module in the first embodiment. The cause of this is considered that the connecting portion 402a is located away from the corner of the ceramic package 400. Therefore, it can be said that as the distance between two connecting portions 402 adjacent to each other is shorter, the coupling strength between the ceramic packages 400 and a mounting board 600 becomes higher.

Third Embodiment

Figure 9A:
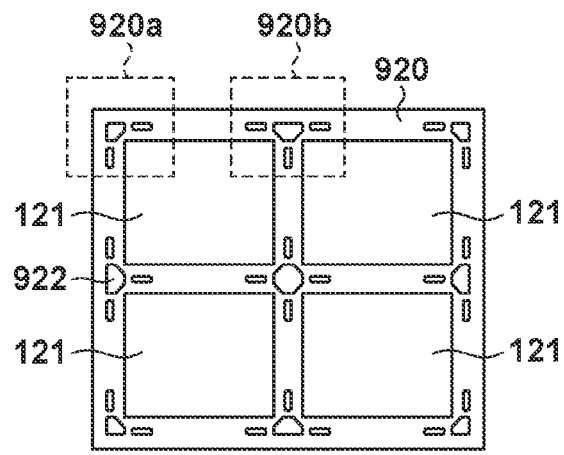
FIGS. 9A to 9D are views for explaining a method of manufacturing a ceramic package according to some embodiments.
Figure 9B:
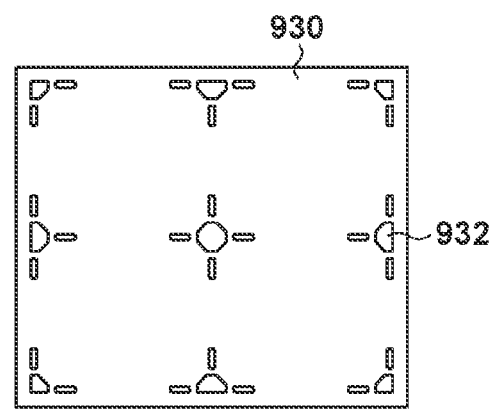
Figure 9C:
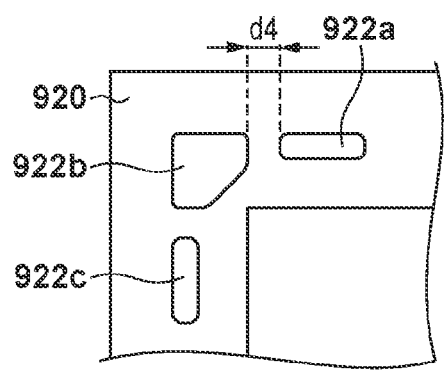
Figure 9D:
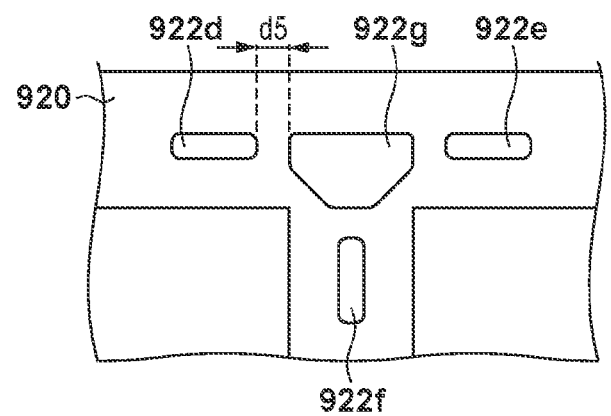

A method of manufacturing a ceramic package according to the third embodiment will be described with reference to FIGS. 9A to 11. A difference from the first embodiment will mainly be described below. Contents whose description will be omitted in the third embodiment may be the same as in the first embodiment. In the method of manufacturing the ceramic package of the third embodiment, a ceramic green sheet 920 of FIG. 9A is used instead of a ceramic green sheet 120, and a ceramic green sheet 930 of FIG. 9B is used instead of a ceramic green sheet 130. FIG. 9C is an enlarged view showing a portion 920a of the ceramic green sheet 920. FIG. 9D is an enlarged view showing a portion 920b of the ceramic green sheet 920. The ceramic green sheet 920 is different from the ceramic green sheet 120 in that it uses holes 922 instead of holes 122. The ceramic green sheet 930 is different from the ceramic green sheet 130 in that it uses holes 932 instead of holes 132.

Like the holes 122, the holes 922 are used to form connecting portions on the side surfaces of the ceramic package. In FIG. 9A, each reference numeral denotes only one hole 922 but out of holes in the ceramic green sheet 920, all the holes other than four holes 121 are the holes 122. The holes 922 will be described in detail with reference to FIGS. 9C and 9D. In FIGS. 9C and 9D, "a" to "g" are added after the reference numerals in order to discriminate the plurality of holes 922.

As shown in FIG. 9C, a hole 922b is arranged so as to be adjacent to a hole 922a and a hole 922c. With such an arrangement, it is possible to make the connecting portion formed by using the hole 922a and the connecting portion formed by using the hole 922b adjacent to each other. The hole 922a and the hole 922b are arranged at a distance of d4. The relationship between the hole 922b and the hole 922c is the same as that between the hole 922b and the hole 922a.

As shown in FIG. 9D, a hole 922g is arranged so as to be adjacent to a hole 922d, a hole 922e, and a hole 922f. The relationship between the hole 922g and each hole adjacent to this is the same as the relationship between the hole 922b and the hole 922a. The hole 922g and the hole 922d are arranged at a distance of d5. The distances d4 and d5 may have the same value or different values. In order to suppress damage to the ceramic green sheet 920, each of the distances d4 and d5 may be larger than the thickness of the ceramic green sheet 920. Instead of this, each of the distances d4 and d5 may be equal to or smaller than the thickness of the ceramic green sheet 920.

Figure 10:
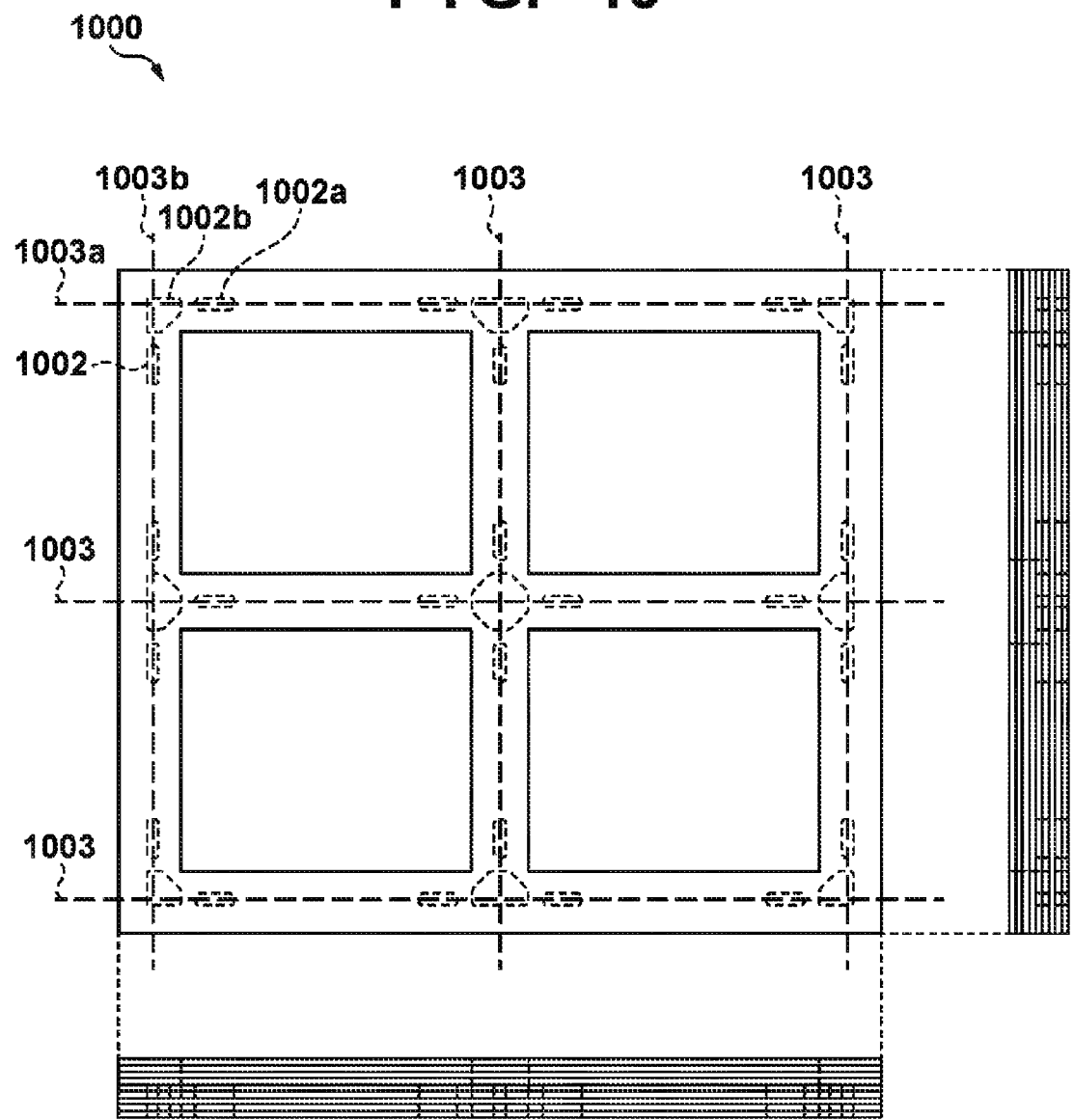
FIG. 10 shows views for explaining the method of manufacturing the ceramic package according to some embodiments.

Then, as shown in FIG. 10, a ceramic member 1000 is formed by using one or more of ceramic green sheets 100 and 110, and the ceramic green sheets 920, and 930, as in the first embodiment. In an example of FIG. 10, the ceramic member 1000 is formed by stacking four ceramic green sheets 110, two ceramic green sheets 920, and three ceramic green sheets 930 in this order from the top. In FIG. 10, an upper left view is a plan view showing the ceramic member 1000, a lower left view is a front view showing the ceramic member 1000, and a right view is a side view showing the ceramic member 1000.

The ceramic member 1000 includes electrically conductive members 1002 formed by drying an electrically conductive paste applied to the inside of each of the holes 922 and 932 on one or more of the ceramic green sheets 920 and 930. In FIG. 10, "a" and "b" are added after the reference numerals of some of the electrically conductive members 1002 in order to discriminate the plurality of electrically conductive members 1002. The reference numerals for some of the electrically conductive members 1002 will not be given.

The electrically conductive members 1002 pass through the holes 922 of the ceramic green sheets 920 and the holes 932 of the ceramic green sheets 930. For example, electrically conductive members 1002a and 1002b pass through the holes 922a and 922b, respectively. Each electrically conductive member 1002 has a hollow structure, and covers the inner surfaces of the ceramic member 1000 facing the holes 922 and 932. The electrically conductive members 1002 adhere to the inner surfaces of the holes through which they pass, and thus the distance between two electrically conductive members 1002 adjacent to each other is equal to the distance between two holes through which they pass. For example, the distance between the electrically conductive member 1002a and the electrically conductive member 1002b is equal to the distance d4 between the hole 922a and the hole 922b after burning.

Then, a ceramic package 1100 (FIG. 11) is formed from the ceramic member 1000 by dividing the ceramic member 1000 by planes 1003 passing through the electrically conductive members 1002. The planes 1003 are illustrated as lines in the plan view of FIG. 10. In FIG. 10, "a" and "b" are added after the reference numerals of some of the planes 1003 in order to discriminate the plurality of planes 1003. As shown in FIG. 10, the ceramic member 1000 is divided by six planes 1003. All the six planes 1003 pass through the holes 922 and 932. Therefore, the electrically conductive members 1002 are also divided by dividing the ceramic member 1000. For example, seven electrically conductive members 1002 including the electrically conductive members 1002a and 1002b are divided by dividing the ceramic member 1000 by a plane 1003a. Three electrically conductive members 1002 including the electrically conductive member 1002b are divided by dividing the ceramic member 1000 by a plane 1003b. The electrically conductive member 1002b is also divided by the plane 1003b. Each portion of the divided electrically conductive members 1002 is positioned on the side surface of the ceramic package 1100 and becomes the connecting portion.

Figure 11:
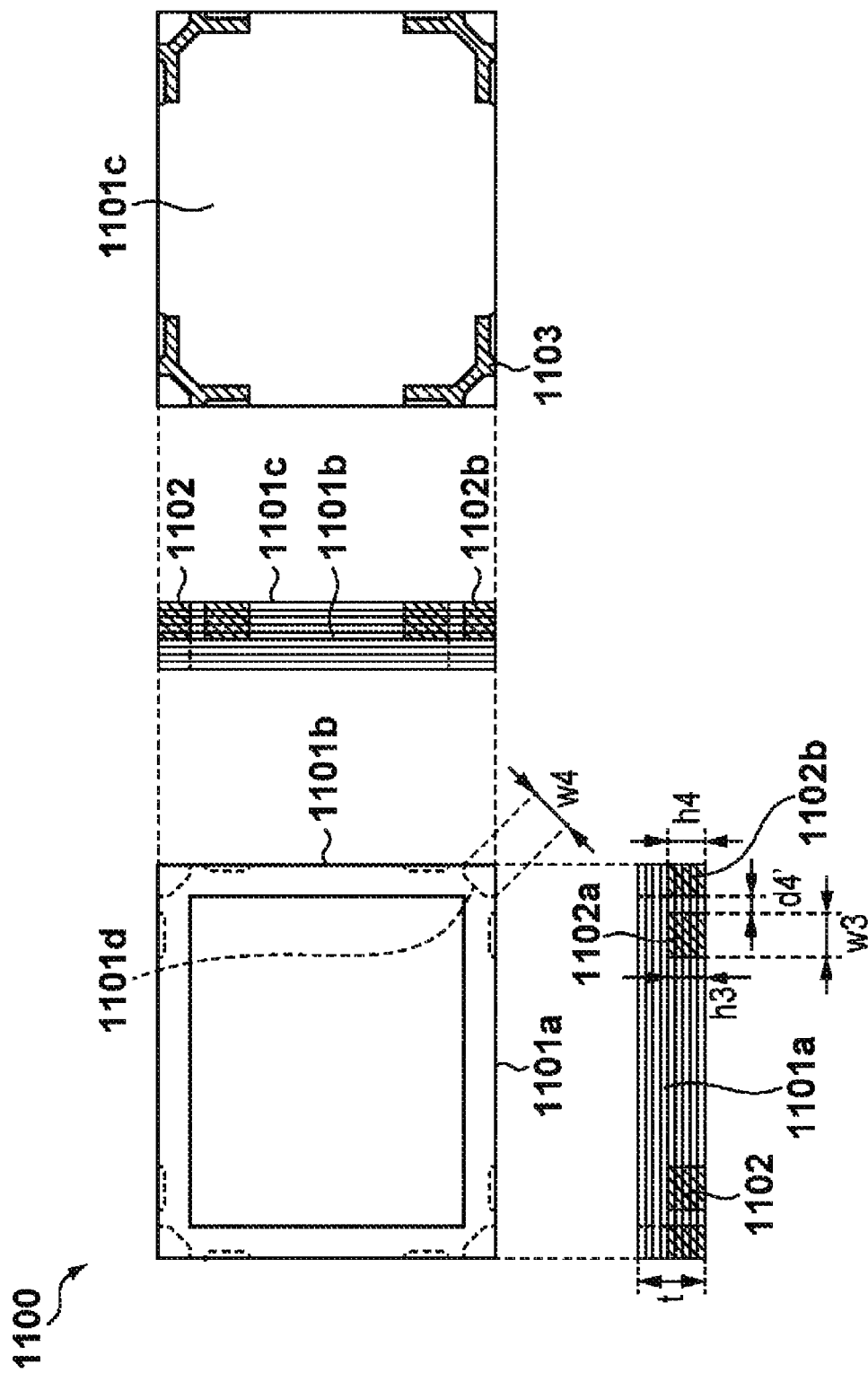
FIG. 11 shows views for explaining the ceramic package according to some embodiments.

The ceramic package 1100 manufactured by the above-described method will be described with reference to FIG. 11. In FIG. 11, an upper left is a plan view showing the ceramic package 1100, a lower left view is a front view showing the ceramic package 1100, an upper center view is a side view showing the ceramic package 1100, and an upper right view is a bottom view showing the ceramic package 1100. The front view and the side view, respectively, show the different side surfaces of the ceramic package 1100.

The ceramic package 1100 has a rectangular shape with four side surfaces made of two pairs of side surfaces facing each other. Four side surfaces include two side surfaces 1101a and 1101b adjacent to each other. The ceramic package 1100 further has a bottom surface 1101c and a surface 1110d at a corner. The surface 1110d crosses two side surfaces 1101a and 1101b. As described above, some of the corners of the ceramic package 1100 are chamfered.

Each side surface of the ceramic package 1100 includes two connecting portions 1102. The surface at each corner of the ceramic package 1100 includes one connecting portion 1102. In FIG. 11, "a" and "b" are added after the reference numerals of some of the connecting portions 1102 in order to discriminate the plurality of connecting portions 1102. Each connecting portion 1102 is one of a plurality of portions obtained by dividing the electrically conductive members 1002 formed in the ceramic member 1000 by the planes 1003. For example, a connecting portion 1102a is a part of the electrically conductive member 1002a, and a connecting portion 1102b is a part of the electrically conductive member 1002b. A distance between the connecting portion 1102a and the connecting portion 1102b is indicated by d4'. The connecting portion 1102a is the part of the electrically conductive member 1002a, and the connecting portion 1102b is the part of the electrically conductive member 1002b. Accordingly, the distance d4' between the connecting portion 1102a and the connecting portion 1102b corresponds to the distance d4 between the electrically conductive member 1002a and the electrically conductive member 1002b.

The width and the height of each connecting portion 1102 are also defined in the same way as those of each connecting portion 402. Each connecting portion 1102 has an oblong shape with the width of the connecting portion 1102 larger than the height of the connecting portion 1102. For example, a width w3 of the connecting portion 1102a is larger than a height h3 of the connecting portion 1102a. Similarly, a width w4 of the connecting portion 1102b is larger than a height h4 of the connecting portion 1102b.

The distance between two connecting portions 1102 adjacent to each other is smaller than the width of at least one of these connecting portions 1102. For example, the distance d4' between the connecting portion 1102a and the connecting portion 1102b is smaller than at least one of the width w3 of the connecting portion 1102a and the width w4 of the connecting portion 1102b. Further, the distance between two connecting portions 1102 adjacent to each other may be smaller than each of the widths of these connecting portions 1102. Also, the distance of two connecting portions 1102 adjacent to each other may be smaller than the thickness of the ceramic member 1000 after burning, that is, a thickness t of the ceramic package 1100. Furthermore, the distance of two connecting portions 1102 adjacent to each other may be smaller than each of the heights of these two connecting portions.

The ceramic package 1100 may further include connecting portions 1103 for solder joint on the bottom surface 1101c. The coupling strength between the ceramic package 1100 and the mounting board is further increased by jointing the connecting portions 1103 to the mounting board with solder.

Then, an experimental result in an example of the third embodiment will be described. The ceramic package of the example was manufactured on the following conditions. First, each ceramic green sheet 100 after burning had the size of 11.6 mm×13.6 mm and the thickness of 0.25 mm. As described above, the ceramic package 1100 having the thickness t of 2.25 mm was formed by forming the ceramic member 1000 by stacking nine ceramic green sheets. Both the distances d4 and d5 between two holes 922 adjacent to each other after burning were 0.5 mm. Accordingly, the distance between two connecting portions 1102 adjacent to each other was also 0.5 mm. The connecting portion 1102a had the width w3 of 1.5 mm and the height h3 of 1.25 mm. The connecting portion 1102b had the width w4 of 4.5 mm and the height h4 of 1.25 mm. The ceramic package manufactured on these conditions had the structure described in the comparative example, and occurrence of a failure caused by deforming the ceramic green sheets was suppressed as compared with a ceramic package manufactured on the same condition. A desired life was obtained by making a prediction about the life of a wear-out failure in solder 611 of a module on which the ceramic package manufactured on these conditions was mounted.

The ceramic package 1100 of the third embodiment is chamfered at its corners, and thus is shorter than the ceramic packages 400 of the first embodiment in length in a diagonal direction. Accordingly, the distance between a mounting board 600 and the center of the ceramic package 1100 when the mounting board 600 is in a direction to be located away from the center becomes shorter than those for ceramic packages 400. Therefore, when the mounting board 600 is in the direction to be located away from the center, the ceramic package 1100 has a lower possibility of a contact failure occurring than the ceramic packages 400.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-088481, filed Apr. 26, 2016, which is hereby incorporated by reference herein in its entirety.

What is claimed is:

1. A method of manufacturing a ceramic package, the method comprising:
   preparing a plurality of ceramic green sheets including one or more first ceramic green sheets;
   forming a first hole and a second hole in each of the first ceramic green sheets such that a distance between the first hole and the second hole in each first ceramic green sheet of the first ceramic green sheets is smaller than both a length of the first hole in a first direction parallel to a bottom surface of the first ceramic green sheet and a length of the second hole in a second direction parallel to the bottom surface of the first ceramic green sheet, and such that both the length of the first hole in the first direction and the length of the second hole in the second direction in each of the first ceramic green sheets are larger than a total thickness of the first ceramic green sheets;
   applying an electrically conductive paste to an inside of the first hole and an inside of the second hole of each of the first ceramic green sheets;
   stacking the plurality of ceramic green sheets such that the first ceramic green sheets are consecutive, after applying the electrically conductive paste, to form stacked ceramic green sheets;
   forming a ceramic member including a first electrically conductive member passing through the first hole and a second electrically conductive member passing through the second hole by burning the stacked ceramic green sheets; and
   dividing the ceramic member along the first direction and the second direction so as to divide each of the first electrically conductive member and the second electrically conductive member, thereby forming a first connecting portion that is a part of the first electrically conductive member on a side surface appearing by the dividing of the ceramic member, and a second connecting portion that is a part of the second electrically conductive member on a side surface appearing by the dividing of the ceramic member.

2. The method according to claim 1, wherein the distance between the first hole and the second hole in each first ceramic green sheet is smaller than a total thickness of the plurality of ceramic green sheets.

3. The method according to claim 1, wherein a length of the first connecting portion in a third direction perpendicular to a bottom surface of the ceramic package is smaller than a thickness of the ceramic member, and a length of the second connecting portion in the third direction is smaller than the thickness of the ceramic member.

4. The method according to claim 1, wherein a distance between the first connecting portion and the second connecting portion is smaller than a length of the first connecting portion in a third direction perpendicular to a bottom surface of the ceramic package and smaller than a length of the second connecting portion in the third direction.

5. The method according to claim 1, wherein the distance between the first hole and the second hole in the first ceramic green sheet is larger than a thickness of the first ceramic green sheet.

6. The method according to claim 1, wherein the ceramic package has four side surfaces made of two pairs of side surfaces facing each other, and the four side surfaces include a first side surface and a second side surface adjacent to each other, and
   wherein the first connecting portion is formed on the first side surface, and the second connecting portion is formed on the second side surface.

7. The method according to claim 1, wherein the ceramic package has:
   four side surfaces made of two pairs of side surfaces facing each other; and
   a surface crossing two side surfaces adjacent to each other out of the four side surfaces, and
   wherein the second connecting portion is formed on the surface, and the first connecting portion is formed on a side surface crossing the surface.

8. The method according to claim 1, wherein the first connecting portion and the second connecting portion are formed on the same side surface.

9. The method according to claim 1, wherein the applying the electrically conductive paste includes applying the electrically conductive paste to side walls so as not to close the first hole and the second hole.

10. The method according to claim 1, wherein the applying the electrically conductive paste includes applying the electrically conductive paste around the first hole and the second hole.

11. The method according to claim 1, wherein
    the first electrically conductive member is formed by the electrically conductive paste applied to the inside of the first hole in the first ceramic green sheets, and the second electrically conductive member is formed by the electrically conductive paste applied to the inside of the second hole in the first ceramic green sheets.

12. The method according to claim 11, wherein part of the plurality of ceramic green sheets include a third hole and the third hole is to form at least part of a cavity for containing an electronic device mounted on the ceramic package.

13. The method according to claim 12, wherein the third hole is larger than each of the first hole and the second hole.

14. The method according to claim 12, wherein the first ceramic green sheets are formed to include the first hole, the second hole, and the third hole.

15. The method according to claim 12, wherein the electrically conductive paste is not applied to an inside of the third hole.

16. The method according to claim 1, wherein the plurality of ceramic green sheets includes a ceramic green sheet in which the first hole and the second hole are not to be formed.

17. The method according to claim 1, wherein the first direction intersects the second direction.

* * * * *